United States Patent
Eto et al.

(10) Patent No.: US 8,206,509 B2
(45) Date of Patent: Jun. 26, 2012

(54) CLEANING LIQUID FOR LITHOGRAPHY AND METHOD FOR FORMING WIRING

(75) Inventors: Takahiro Eto, Kawasaki (JP); Takuya Ohhashi, Kawasaki (JP); Masaru Takahama, Kawasaki (JP); Daijiro Mori, Kawasaki (JP); Akira Kumazawa, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 12/958,295

(22) Filed: Dec. 1, 2010

(65) Prior Publication Data

US 2011/0129998 A1 Jun. 2, 2011

(30) Foreign Application Priority Data

Dec. 2, 2009 (JP) ................................. 2009-274394

(51) Int. Cl.
- B08B 3/04 (2006.01)
- C11D 7/32 (2006.01)
- C11D 7/50 (2006.01)

(52) U.S. Cl. ......... 134/1.3; 510/175; 510/176; 510/245; 510/255; 510/259; 510/264; 510/272; 510/500; 510/504

(58) Field of Classification Search ............ 510/175, 510/176, 245, 255, 259, 264, 272, 500, 504; 134/1.2, 1.3
See application file for complete search history.

(56) References Cited

U.S. PATENT DOCUMENTS

2005/0287480 A1* 12/2005 Takashima .................... 430/331

FOREIGN PATENT DOCUMENTS

| JP | 2002-357908 | | 12/2002 |
|---|---|---|---|
| JP | 2004-103771 | | 4/2004 |
| JP | 2006-527783 | | 12/2006 |
| WO | WO2008/039730 | * | 4/2008 |

* cited by examiner

*Primary Examiner* — Gregory Delcotto
(74) *Attorney, Agent, or Firm* — Knobbe, Martens, Olson & Bear, LLP

(57) ABSTRACT

Provided are a cleaning liquid for lithography that exhibits excellent corrosion suppression performance in relation to tungsten, and excellent removal performance in relation to a resist film or the like, and a method for forming a wiring using the cleaning liquid for lithography. The cleaning liquid for lithography according to the present invention includes a quaternary ammonium hydroxide, a water-soluble organic solvent, water, an inorganic salt and an anti-corrosion agent represented by a general formula (1) below.

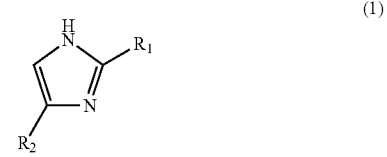

(1)

In the general formula (1), $R_1$ represents an alkyl group or an aryl group having 1-17 carbon atoms, and $R_2$ represents an alkyl group having 1-13 carbon atoms.

5 Claims, No Drawings

CLEANING LIQUID FOR LITHOGRAPHY AND METHOD FOR FORMING WIRING

This application is based on and claims the benefit of priority from Japanese Patent Application No. 2009-274394, filed on 2 Dec. 2009, the content of which is incorporated herein by reference.

BACKGROUND OF THE INVENTION

1. Field of the Invention

The present invention relates to a cleaning liquid for lithography. More particularly, the present invention relates to a cleaning liquid for lithography that enables efficient cleaning and removal of a resist film, a sacrificial film, and furthermore residue material originating from a metallic wiring layer or low dielectric constant layer produced during an etching step, without causing corrosion to corrosion-prone materials such as tungsten, copper, a low dielectric constant material, or the like. Furthermore the present invention relates to a method for forming a wiring using the cleaning liquid for lithography.

2. Related Art

A semiconductor device laminates a metallic wiring layer, a low dielectric constant layer, an insulation layer, or the like on a substrate such as a silicon wafer, and the like. This type of semiconductor device is manufactured by processing each layer using a lithography method that employs an etching process using a resist pattern as a mask.

The resist film or a temporary laminate film (termed "a sacrificial film") used in the lithography method, and furthermore residue material originating from a metallic wiring layer or a low dielectric constant layer produced during the etching process is removed using a cleaning liquid to prevent an adverse effect on the semiconductor device, and furthermore to prevent impediment to a subsequent processing step.

In recent years, methods for forming a wiring using a damascene method have been employed in respond to advances in high-density and highly integrated semiconductor devices. Copper that is prone to undergo corrosion is used as a metallic wiring material that configures the metallic wiring layer of the semiconductor device in this type of wiring formation method. Furthermore, a low dielectric constant material (termed an "ILD material") is used to configure the low dielectric constant layer. Advances in achieving a low dielectric constant have resulted in use of such ILD materials that are prone to undergo corrosion. Consequently, there is a need for development of a cleaning liquid that does not cause corrosion of such corrosion-prone materials when washing the substrate.

In a method for forming a wiring using a damascene method, the material used as a sacrificial film during the etching process bears an extremely strong resemblance to the configuration of an ILD material. Consequently there is a need for development of a cleaning liquid that leaves one of these strongly similar materials (the ILD material) on the device without causing corrosion while enabling efficient removal of the other material (sacrificial film).

Furthermore, in a method for forming a conventional aluminum wiring, there has been no need for high cleaning performance in a cleaning liquid since a washing process using a chemical liquid is performed after an oxygen-plasma ashing process step. However this type of oxygen-plasma ashing process cannot be used during washing of a substrate that includes a corrosion-prone material such as copper or an ILD material as described above. Consequently, there is a need for development of a cleaning liquid that has robust cleaning performance enabling complete removal of various types of residue materials even in the absence of the above type of oxygen-plasma ashing process step.

A conventional cleaning liquid for lithography used in a manufacturing process of this type of semiconductor device has been proposed that has a quaternary ammonium hydroxide as a principal component (for example, refer to Patent Documents 1 and 2). A cleaning liquid for lithography that has a quaternary ammonium hydroxide as a principal component realizes a large improvement in relation to removal performance of various types of residue materials in comparison to previous cleaning liquids, and exhibits excellent corrosion suppression performance in relation to corrosion-prone materials.

A cleaning liquid for lithography has also been proposed in which 1 mass % or less of potassium hydroxide relative to the total mass is added to a material having a quaternary ammonium hydroxide as a principal component (refer to Patent Document 3). A cleaning liquid for lithography including potassium hydroxide as described above achieves a higher level of removal performance without causing corrosion of a corrosion-prone material such as copper or an ILD material.

Patent Document 1: Japanese Unexamined Patent Application, First Publication No. 2002-357908

Patent Document 2: Japanese Unexamined Patent Application, First Publication No. 2004-103771

Patent Document 3: Japanese Translation of PCT International Publication, No. 2006-527783

SUMMARY OF THE INVENTION

However in recent years, a semiconductor device has been proposed that uses a tungsten plug as a contact plug, and forms a multilayer wiring structure of copper using a damascene method on the layer forming the tungsten plug. Although the cleaning liquids for lithography disclosed in the above-mentioned Patent Documents exhibit excellent corrosion suppression performance in relation to copper or an ILD material, the corrosion suppression performance is insufficient in relation to tungsten. Consequently, there is the problem that tungsten is corroded when an etching space is formed due to use of a resist film in a dielectric layer on the layer forming a tungsten plug, and a cleaning liquid for lithography is used to attempt to remove at least the resist film.

The present invention has been proposed in light of the above situation, and has the object of providing a cleaning liquid for lithography that exhibits excellent corrosion suppression performance in relation to tungsten, and excellent removal performance in relation to a resist film or the like, in addition to providing a method for forming a wiring using the cleaning liquid for lithography.

The present inventors performed diligent research to solve the above problems. As a result, the present invention was completed with the insight that the above problems could be solved by the addition of a specific imidazole derivative to the cleaning liquid for lithography. More specifically, the present invention is configured as described below.

A first aspect of the present invention is a cleaning liquid for lithography including a quaternary ammonium hydroxide, a water-soluble organic solvent, water, an inorganic salt, and an anti-corrosion agent expressed by a general formula (1) below.

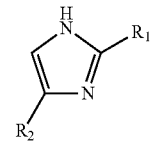

in the above general formula (1), $R_1$ represents an alkyl group or an aryl group having 1-17 carbon atoms, and $R_2$ represents an alkyl group having 1-13 carbon atoms.

A second aspect of the present invention is a method for forming a wiring which forms a metallic wiring layer by embedding a metal in an etching space that is formed in a dielectric layer of a semiconductor multilayer laminate using a resist film. At least the resist film is removed using the cleaning liquid for lithography according to the present invention after formation of the etching space.

According to the present invention, a cleaning liquid for lithography, and a method for forming a wiring using the cleaning liquid for lithography, can be provided that exhibits excellent corrosion suppression performance in relation to tungsten, and that exhibits excellent removal performance for a resist film or the like.

DETAILED DESCRIPTION OF THE INVENTION

Cleaning Liquid for Lithography

The cleaning liquid for lithography according to the present invention includes a quaternary ammonium hydroxide, a water-soluble organic solvent, water, an inorganic salt and an anti-corrosion agent. Although the invention will be described in detail hereafter, in the absence of a particular limitation, each material may be a commercially available substance.

Quaternary Ammonium Hydroxide

The quaternary ammonium hydroxide is preferably a compound expressed by a general formula (2) below.

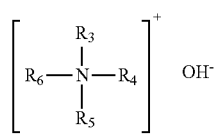

(2)

In the above general formula (2), $R_3$—$R_6$ independently represent an alkyl group or a hydroxyalkyl group having 1-4 carbon atoms.

A compound represented by the above general formula (2) may be selected from at least one of the group consisting of tetramethyl ammonium hydroxide, tetraethyl ammonium hydroxide, tetrapropyl ammonium hydroxide, tetrabutyl ammonium hydroxide, methyl tripropyl ammonium hydroxide, methyl tributyl ammonium hydroxide, and (2-hydroxyethyl) trimethyl ammonium hydroxide. Such compounds being particularly preferred due to being freely available. Furthermore tetramethyl ammonium hydroxide and/or tetraethyl ammonium hydroxide are preferred in light of high dissolution properties in relation to a sacrificial film.

The content amount of the quaternary ammonium hydroxide is preferably 1 mass %-20 mass % relative to the total mass of the cleaning liquid for lithography, and more preferably 2 mass %-15 mass %. This content amount enables suppression of corrosion of copper, ILD materials or the like while at the same time enabling effective removal of the resist film, the sacrificial film, and furthermore residual material originating from a metallic wiring layer or low dielectric constant layer produced as a result of an etching step.

Water-Soluble Organic Solvent

The water-soluble organic solvent may be a compound that is well-known in this technical field. The water-soluble organic solvent may be broadly divided into alkanolamine water-soluble organic solvents and other water-soluble organic solvents, and may be used by suitable selection thereof.

The alkanolamine water-soluble organic solvents above may be a well-known compound. More specifically, for example, the compound includes monoethanolamine, diethanolamine, triethanolamine, 2-(2-amino-ethoxy)ethanol, N,N-dimethylethanolamine, N,N-diethylethanolamine, N,N-dibutylethanolamine, N-methylethanolamine, N-ethylethanolamine, N-butylethanolamine, N-methyldiethanolamine, monoisopropanolamine, diisopropanolamine, triisopropanolamine, or the like.

Of the above compounds, the compound may preferably be selected from at least one of the group consisting of monoethanolamine, 2-(2-amino-ethoxy)ethanol, and N-methylethanolamine, and monoisopropanolamine. Two or more of these alkanolamine water-soluble organic solvents may be mixed as required.

Water-soluble organic solvents other than an alkanolamine water-soluble organic solvent include for example sulfoxides such as dimethylsulfoxide, or the like; sulfones such as dimethylsulfone, diethylsulfone, bis(2-hydroxyethyl) sulfone, tetramethylene sulfone, or the like; amides such as N,N-dimethyl formamide, N-methyl formamide, N,N-dimethyl acetamide, N-methyl acetamide, N—N, diethyl acetamide, or the like; lactams such as N-methyl-2-pyrolidone, N-ethyl-2-pyrolidone, N-hydroxmethyl-2-pyrolidone, N-hydroxethyl-2-pyrolidone, or the like; lactones such as β-propiolactone, γ-butyrolactone, γ-valerolactone, δ-valerolactone, γ-caprolactone, ε-caprolactone, or the like; imidazolidinones such as 1,3-dimethyl-2-imidazolidinone, 1,3-diethyl-2-imidazolidinone, 1,3-diisopropyl-2-imidazolidinone, or the like; polyhydric alcohols and derivatives thereof such as ethylene glycol, ethylene glycol monomethyl ether, ethylene glycol monomethyl ether, ethylene glycol monoethyl ether, ethylene glycol monobutyl ether, ethylene glycol monoacetate, ethylene glycol monomethyl ether acetate, ethylene glycol monoethyl ether acetate, diethylene glycol, diethylene glycol monoacetate, diethylene glycol monomethyl ether, monoacetate, diethylene glycol monoethyl ether, diethylene glycol monobutyl ether, propylene glycol, propylene glycol monomethyl ether, propylene glycol monoethyl ether, propylene glycol monopropyl ether, dipropylene glycol monomethyl ether, glycerin, 1,2-butylene glycol, 1,3-butylene glycol, 2,3-butylene glycol, or the like.

Those compounds selected as preferred solvents from the above may be selected from at least one of the group consisting of dimethylsulfoxide, propylene glycol monomethyl ether, propylene glycol monoethyl ether, propylene glycol monopropyl ether, diethylene glycol monoethyl ether, and diethylene glycol monobutyl ether. A water-soluble organic solvent other than the above alkanolamine water-soluble organic solvents may be used by suitable mixture of two or more types thereof as required.

The content amount of these water-soluble organic solvents is preferably 1-82 mass %, and more preferably 2-78 mass % relative to the total amount of the cleaning liquid for lithography. This content amount enables suppression of corrosion of copper, ILD materials or the like while at the same time enabling effective removal of the resist film, the sacrificial film, and furthermore residual material originating from a metallic wiring layer or low dielectric constant layer produced as a result of an etching step.

The water-soluble organic solvent may be an alkanolamine water-soluble organic solvent, or may be other water-soluble organic solvent. In the event that either is used in isolation, use of a water-soluble organic solvent other than an alkanolamine water-soluble organic solvent is preferred. This is due to the fact that corrosion of ILD materials is more effectively suppressed in comparison to use in isolation of an alkanolamine water-soluble organic solvent.

Furthermore an alkanolamine water-soluble organic solvent and non-alkanolamine water-soluble organic solvent may be used as a mixed solvent. Use of this type of mixed solvent enables further improvement to the removal performance in relation to the resist film, the sacrificial film, and furthermore residue material originating from a metallic wiring layer or a low dielectric constant layer produced during an etching step.

When using the mixed solvent, the content amount of the alkanolamine water-soluble organic solvent is preferably 1 mass %-50 mass %, and more preferably 2 mass %-40 mass % relative to the total amount of the cleaning liquid for lithography. The content amount of the water-soluble organic solvent other than an alkanolamine water-soluble organic solvent is taken to be the residual portion relative to the alkanolamine water-soluble organic solvent above of the total content amount of the water-soluble organic solvent.

Water

The content amount of water is preferably 10 mass %-80 mass %, and more preferably 15 mass %-70 mass % relative to the total amount of the cleaning liquid for lithography. This content amount enables suppression of corrosion of copper, ILD materials or the like while at the same time enabling effective removal of the resist film, the sacrificial film, and furthermore residual material originating from a metallic wiring layer or low dielectric constant layer produced as a result of an etching step.

Inorganic Salt

The inorganic salt is preferably an alkali-metal hydroxide including potassium hydroxide, sodium hydroxide, rubidium hydroxide, or the like, with potassium hydroxide being more preferred. The content amount of the inorganic salt is preferably 0.1 mass ppm-1 mass %, and more preferably 1 mass ppm-0.5 mass % relative to the total amount of the cleaning liquid for lithography. This content amount enables suppression of corrosion of copper, ILD materials or the like while at the same time improving removal performance in relation to a sacrificial film.

Anti-Corrosion Agent

The anti-corrosion agent may be a compound as represented by a general formula (1) below.

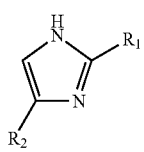

(1)

In the above general formula (1), $R_1$ represents an alkyl group or an aryl group having 1-17 carbon atoms, $R_2$ represents an alkyl group having 1-13 carbon atoms. $R_1$ is preferably an alkyl group or an aryl group having 1-11 carbon atoms, and more preferably an alkyl group having 1-6 carbon atoms or a phenyl group. $R_2$ is preferably an alkyl group having 1-6 carbon atoms, and more preferably a methyl or an ethyl group. The alkyl group may be any of a straight-chain, branched-chain or cyclic alkyl group.

Of the compounds represented by the above general formula (1), at least one compound may be selected from the group consisting of 2-ethyl-4-methyl imidazole, 2-methyl-4-ethyl imidazole, 2,4-dimethyl imidazole, 2-n-butyl-4-methyl imidazole, 2-cyclohexyl-4-methyl imidazole, and 2-phenyl-4-methyl imidazole.

The content amount of the compounds represented by the above general formula (1) is preferably 0.1 mass %-10 mass %, and more preferably 0.5 mass %-5 mass % relative to the total amount of the cleaning liquid for lithography. This content amount enables suppression of corrosion of tungsten while at the same time enabling effective removal of the resist film, the sacrificial film, and furthermore residual material originating from a metallic wiring layer or low dielectric constant layer produced as a result of an etching step.

The cleaning liquid for lithography according to the present invention may further contain at least one anti-corrosion agent selected from a benzotriazol compound and a mercapto group containing compound.

The benzotriazol compound includes compounds represented by a general formula (3) below.

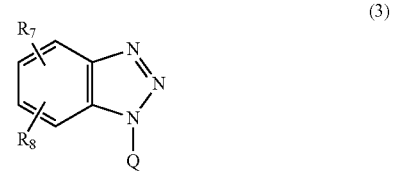

(3)

In the above general formula (3), $R_7$ and $R_8$ independently represent a hydrogen atom, a hydrocarbon group having 1-10 carbon atoms that may includes a substitution group, a carboxyl group, an amino group, a hydroxyl group, a cyano group, a formyl group, a sulfonylalkyl group, or a sulfo group, Q represents a hydrogen atom, a hydroxyl group, a hydrocarbon group having 1-14 carbon atoms that may includes a substitution group (wherein however, the hydrocarbon group may be interrupted by amide bonds or ester bonds), or a group represented by a general formula (4) below.

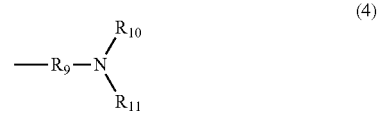

(4)

In the above general formula (4), $R_9$ represents an alkylene group having 1-6 carbon atoms, $R_{10}$ and $R_{11}$ independently represent a hydrogen atom, a hydroxyl group, or a hydroxyalkyl group or an alkoxyalkyl group having 1-6 carbon atoms.

In each of the definitions of $R_7$, $R_8$, and Q in the above general formula (3), the hydrocarbon group may be either an aromatic hydrocarbon group or an aliphatic hydrocarbon group, may include unsaturated bonds, and may be straight-chained, branched-chained or cyclic hydrocarbon group. The aromatic hydrocarbon group may be for example a phenyl group, a p-tolyl group, or the like. The straight-chained aliphatic hydrocarbon group may be for example a methyl group, an n-propyl group, a vinyl group, or the like. The branched-chained aliphatic hydrocarbon group for example may be an i-butyl group, a t-butyl group, or the like. A cyclic aliphatic hydrocarbon group for example may be a cyclopentyl group, a cyclohexyl group, or the like. A hydrocarbon group including a substitution group may be for example a hydroxyalkyl group, an alkoxyalkyl group, or the like.

Q in the above general formula (3) is preferably a group represented in the above general formula (4). In particular, of the groups represented in the above general formula (4), $R_{10}$, $R_{11}$ are preferably independently selected from a hydroxyalkyl group or an alkoxyalkyl group having 1-6 carbon atoms.

Furthermore Q is preferably selected so that the compound represented by the above general formula (3) exhibits water-soluble properties. More specifically, a hydrogen atom, an alkyl group having 1-3 carbon atoms (that is to say, a methyl group, an ethyl group, a propyl group, an isopropyl group), a hydroxyalkyl group having 1-3 carbon atoms, a hydroxyl group, or the like are preferred.

For example, the benzotriazol compound more specifically includes benzotriazol, 5,6-dimethyl benzotriazol, 1-hydroxy benzotriazol, 1-methyl benzotriazol, 1-amino benzotriazol, 1-phenyl benzotriazol, 1-hydroxymethyl benzotriazol, methyl-1-benzotriazol carboxylate, 5-benzotriazol carboxylate, 1-methoxy benzotriazol, 1-(2,2-dihydroxyethyl)-benzotriazol, 1-(2,3-dihydroxypropyl)-benzotriazol; and 2,2'-[[(4-methyl-1H-benzotriazol-1-yl)methyl]imino]bisethanol, 2,2'-[[(5-methyl-1H-benzotriazol-1-yl)methyl]imino]bisethanol, 2,2'-[[(4-methyl-1H-benzotriazol-1-yl)methyl]imino]bisethane, 2,2'-[[(4-methyl-1H-benzotriazol-1-yl)methyl]imino]bispropane, and the like that are commercially available from Chiba Specialty Chemicals Co., Ltd. as the "IREGAMET" series. Of the above compounds, 1-(2,3-dihydroxypropyl)-benzotriazol, 2,2'-[[(4-methyl-1H-benzotriazol-1-yl)methyl]imino]bisethanol, 2,2'-[[(5-methyl-1H-benzotriazol-1-yl)methyl]imino]bisethanol, and the like are preferably used. These benzotriazol compounds may be used either singly or in combination of two or more compounds.

The mercapto group containing compound above is preferably a compound containing a hydroxyl group and/or a carboxyl group on at least one of the α-position and the β-position of a carbon atom that is bonded to the mercapto group. More specifically, such compounds include 1-thioglycerol, 3-(2-aminophenylthio)-2-hydroxypropylmercaptane, 3-(2-hydroxyethylthio)-2-hydroxypropylmercaptane, 2-mercaptopropionate, 3-mercaptopropionate, or the like. Of the above compounds, use of 1-thioglycerol is particularly preferred.

Surface Active Agent

The cleaning liquid for lithography according to the present invention may contain a surface active agent as required. The surface active agent is preferably an acetylene alcohol surface active agent, or the like. The content of the surface active agent is preferably less than 0.5 mass % relative to the total amount of the cleaning liquid for lithography.

Method for Forming Wiring

The method for forming a wiring according to the present invention is a method that uses a damascene method in which a metallic wiring layer is formed by embedding metal in an etching space that is formed in a dielectric layer of a semiconductor multilayer laminate using a resist film. After formation of the etching space, at least the resist film can be removed using the cleaning liquid for lithography according to the present invention.

The method for forming a wiring using a damascene method more specifically forms metallic wiring by using a resist pattern formed on a low dielectric constant layer of the semiconductor multilayer laminate as a mask, applying an etching process to the low dielectric constant layer to form an etching space, and then embedding metal into the etching space. A temporary sacrificial film may be embedded in the etching space.

The cleaning liquid for lithography according to the present invention is used when removing the resist film, the sacrificial film, and furthermore residual material originating from a metallic wiring layer or a low dielectric constant layer produced by an etching step. In particular, since the cleaning liquid for lithography according to the present invention exhibits a corrosion suppression function in relation to tungsten, after using the resist film to form an etching space in the dielectric layer on the layer forming the tungsten plug, the cleaning liquid may be suitably used when removing at least the resist layer.

There is no particular limitation on the method of removing the resist film or the like as long as it is a normally used removal method. More specifically, for example, use of an immersion method, a paddle method, a shower method, or the like enables processing by placing the cleaning liquid for lithography according to the present invention in direct contact for 1-40 minutes with the substrate. Although ambient temperature is normally used, the removal process may be performed by heating the cleaning liquid for lithography to approximately 85° C. in order to increase the removal effect.

The material forming the resist film may be a resist material customarily used in a standard method in an excimer laser (KrF, ArF, $F_2$, EUV), or used in relation to electron rays.

Use of this type of customary resist material enables formation of a resist film on an interlayer insulation layer, or on a barrier layer thereon. After using the mask to expose the resist film, a development process is applied to thereby form a resist pattern. Next, residue material of the resist pattern after execution of etching using the resist pattern as a mask is removed by the cleaning liquid for lithography according to the present invention together with other residual material originating from a sacrificial film, and from a metallic wiring layer or a low dielectric constant layer after forming the etching process.

More specifically, the low dielectric constant layer is a layer formed from a material such as a carbon-doped oxide (SiOC), methyl silsesquioxane (MSQ), or hydrogen silsesquioxane (HSQ). The low dielectric constant layers preferably have a dielectric constant (k) of 3.0 or less in order to prevent effects on the electrical characteristics of the metallic wiring layer.

These low dielectric constant layers may be formed on the metallic wiring layer, or may be formed after forming a barrier layer on the metallic wiring layer. The firing temperature for the low dielectric constant layer is normally a high temperature of 350° C. or more.

More specifically, the material forming the low dielectric constant layer as described above, that is to say, a low dielectric material (ILD material) includes carbon-doped oxide black diamond (Trade Name, manufactured by Applied Materials), Coral (Trade Name, manufactured by Novelus Systems), Aurora (Trade Name, manufactured by Japan ASM) and methyl silsesquioxane-based OCL T-31, OCL T-37, OCL T-39 (All Trade Names, manufactured by Tokyo Ohka Kogyo), and hydrogen silsesquioxane-based OCD T-12, OCD T-32 (All Trade Names, manufactured by Tokyo Ohka Kogyo).

The barrier layer may be for example SiC, SiN, SiCN, Ta, TaN, or the like. This type of barrier layer may be formed between a low dielectric constant layer and a low dielectric constant layer.

The metallic material forming the metallic wiring layer used in relation to the damascene method may be mainly Cu, but a conductive material such as Al, Ti, W or the like may be laminated in addition to Cu on the same substrate. The cleaning liquid for lithography according to the present invention enables effective suppression of corrosion even when the cleaning liquid comes into direct contact with these metallic materials.

The cleaning liquid for lithography according to the present invention finds application even when employing a damascene method, and in particular, in a method for forming a wiring using a damascene method in which a temporary sacrificial layer is provided in an formed etching space. More specifically however, the material (embedded material) forming the sacrificial layer is suitably a spin on glass material obtained by a condensation reaction.

The spin on glass material forming the sacrificial film is suitably a compound hydrolyzed by the action of an acid present in water on at least one compound selected from the compounds represented in general formulae (5)-(7) below.

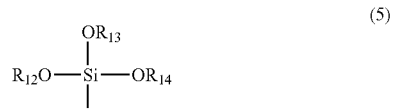
(5)

(6)

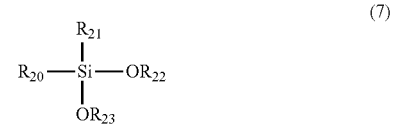
(7)

In the above general formulae (5)-(7), $R_{12}$-$R_{15}$, $R_{17}$-$R_{19}$, $R_{22}$, and $R_{23}$ independently represent an alkyl group having 1-4 carbon atoms or a phenyl group, and $R_{16}$, $R_{20}$, and $R_{21}$ represent a hydrogen atom or an alkyl group having 1-4 carbon atoms.

Of the compounds represented by the above general formula (5), tetramethoxy silane or tetraethoxy silane, or oligomers thereof are preferred. Of the compounds represented by the above general formula (6), trimethoxysilane or triethoxysilane, or oligomers thereof are preferred. Of the compounds represented by the above general formula (7), dimethoxysilane, diethyoxysilane or methyldimethoxysilane, or oligomers thereof are preferred. These spin on glass materials may be used by suitably selecting one or two or more types thereof.

A highly absorbent material may be suitably formulated into the compound represented by the above general formulae (5)-(7). The highly absorbent material may be a material having a substitution group in its structure that condenses with the spin on glass material above, may include a strong absorbent function in relation to light in a specific light-sensitive wavelength band of a light-sensitive component of the resist material, and may be a material that prevents diffuse reflection due to an irregularity on the substrate surface or a standing wave produced by reflected light from the substrate. However there is no particular limitation thereon. Such compounds include sulfone compounds, benzophenone compounds, anthracene compounds, naphthalene compounds or the like that are substituted with hydroxyl groups and/or carboxyl groups. In particular, preferred compounds include bisphenyl sulfone compounds and benzophenone compounds including at least two hydroxyl groups, anthracene compounds including at least one hydroxyl and/or hydroxyalkyl group, anthracene compounds including a carboxyl group and/or a hydroxyl group, and naphthalene compounds substituted with at least one carboxyl group and/or hydroxyl group.

The content amount of the highly absorbent material may be 10-50 mass %, and more preferably 15-40 mass % at a $SiO_2$ equivalent solid concentration in the spin on glass material.

EXAMPLES

Although the embodiments of the present invention will be described hereafter to explain the present invention in further detail, the present invention is not limited by the embodiments below.

Preparation of Cleaning Liquid for Lithography

A cleaning liquid for lithography was prepared based on the formulation amount and the composition shown in Table 1 below. Each test reagent was a generally commercially available reagent unless there is a particular indication to the contrary. The figures in the table express units of mass % unless there is a particular indication to the contrary.

TABLE 1

|  | quaternary ammonium hydroxide | inorganic salt | anti-corrosion agent | water-soluble organic solvent | water |
| --- | --- | --- | --- | --- | --- |
| Example 1 | TMAH (10) | KOH (200 ppm) | EMI (2) | EDG (40) | (residual portion) |
| Example 2 | TMAH (10) | KOH (200 ppm) | EMI (0.1) | EDG (40) | (residual portion) |
| Example 3 | TMAH (10) | KOH (200 ppm) | EMI (10) | EDG (40) | (residual portion) |
| Example 4 | TMAH (10) | KOH (200 ppm) | BMI (2) | EDG (70) | (residual portion) |
| Example 5 | TMAH (10) | KOH (200 ppm) | PMI (2) | EDG (20) | (residual portion) |
| Example 6 | TMAH (10) | KOH (200 ppm) | EMI (11) | EDG (40) | (residual portion) |
| Example 7 | TMAH (10) | KOH (200 ppm) | MEI (2) | EDG (40) | (residual portion) |
| Example 8 | TEAH (10) | NaOH (200 ppm) | EMI (2) | DMSO (40) | (residual portion) |
| Comparative Example 1 | TMAH (10) | KOH (200 ppm) | — | EDG (40) | (residual portion) |
| Comparative Example 2 | TMAH (10) | KOH (200 ppm) | BTA (2) | EDG (40) | (residual portion) |
| Comparative Example 3 | TMAH (10) | KOH (200 ppm) | 1,2 DMI (2) | EDG (40) | (residual portion) |
| Comparative Example 4 | TMAH (10) | KOH (200 ppm) | NMI (2) | EDG (40) | (residual portion) |
| Comparative Example 5 | TMAH (10) | KOH (200 ppm) | 2MPA (2) | EDG (40) | (residual portion) |

TMAH: tetramethyl ammonium hydroxide
TEAH: tetraethyl ammonium hydroxide
EMI: 2-ethyl-4-methyl imidazole
BMI: 2-n-butyl-4-methyl imidazole
PMI: 2-phenyl-4-methyl imidazole
MEI: 2-methyl-4-ethyl imidazole
BTA: benzotriazol
1,2 DMI: 1,2-dimethyl imidazole
NMI: N-methyl imidazole
2MPA: 2-mercapto propionate
EDG: diethylene glycol monoethyl ether
DMSO: dimethylsulfoxide Removal of Resist Film A barrier layer formed from SiC as a first layer and a low dielectric constant layer (the dielectric constant layer was a CVD evaporated film) formed from a Low-k material as a second layer were formed on a substrate having a tungsten layer formed thereon. A resist layer was formed thereupon using an ArF resist material "TArF-P6111" (Tokyo Oka Kogyo). Then a resist pattern was formed using a lithography method, and the resist pattern was used as a mask for etching of the low dielectric constant layer to thereby form a via hole passing through the barrier layer.

Then an embedding material (Honeywell Japan) formed from a spin on glass material was embedded into the via hole to form a sacrificial layer. A resist film was formed using the ArF resist material on the substrate forming the sacrificial layer, and then a resist pattern was formed using a lithography method. The newly formed resist pattern acted as a mask during an etching process to thereby form a trench. At this time, the resist pattern surface was damaged by the etching gas, and therefore an etched resist was formed which is resistant to removal. An Si-type metallic residue material is deposited when etching to remove the Low-k material on the trench pattern side wall, and the embedded material remained in the via hole inner portion.

This substrate was subjected to immersion processing for 10 minutes at 50° C. in the cleaning liquid for lithography in Examples 1-8 and Comparative Examples 1-5 as shown in Table 1, and then rinsed in pure water. Evaluation was performed by observation using an SEM (scanning electron microscope) of the removing characteristics of the etched resist, the removing characteristics of the Si metallic residue material, the removing characteristics of the embedded material, the corrosion state of the Low-k material, and the corrosion state of tungsten. The results are shown in Table 2. In Table 2, "A" denotes complete removal of the object for removing, or complete absence of corrosion of the substrate or tungsten. "B" denotes that the presence of residual removing object on the substrate, or the generation of corrosion with respect to the substrate or tungsten.

TABLE 2

|  | removing characteristics of the etched resist | removing characteristics of the Si metallic residue material | removing characteristics of the embedded material | corrosion state of the Low-k material | corrosion state of tungsten |
| --- | --- | --- | --- | --- | --- |
| Example 1 | A | A | A | A | A |
| Example 2 | A | A | A | A | A |
| Example 3 | A | A | A | A | A |
| Example 4 | A | A | A | A | A |
| Example 5 | A | A | A | A | A |
| Example 6 | A | A | A | A | A |
| Example 7 | A | A | A | A | A |
| Example 8 | A | A | A | A | A |
| Comparative Example 1 | A | A | A | A | B |
| Comparative Example 2 | A | A | A | A | B |
| Comparative Example 3 | A | A | A | A | B |
| Comparative Example 4 | A | A | A | A | B |
| Comparative Example 5 | A | A | A | A | B |

As shown by Table 2, when the cleaning liquid for lithography according to Examples 1-8 that contained an anti-corrosion agent such as 2-ethyl-4-methyl imidazole, 2-n-butyl-4-methyl imidazole, 2-phenyl-4-methyl imidazole, or 2-methyl-4-ethyl imidazole was used, corrosion of the Low-k material or tungsten was suppressed while at the same time, effective removal was enabled of the etched resist, the embedded material, or the Si metallic residue material produced during the etching step.

On the other hand, since an anti-corrosion agent was not present in Comparative Example 1, corrosion was produced on the tungsten. Furthermore when the cleaning liquid for lithography according to Comparative Examples 2-5 that contained an anti-corrosion agent such as benzotriazol, 1,2-dimethyl imidazole, N-methyl imidazole, 2-mercapto propionate was used, effective suppression of corrosion with respect to tungsten was not enabled, and tungsten corrosion resulted.

What is claimed is:

1. A cleaning liquid for lithography comprising a quaternary ammonium hydroxide, a water-soluble organic solvent, water, an inorganic salt and an anti-corrosion agent represented by a general formula (1) below:

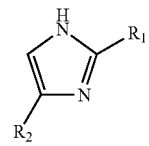

(1)

wherein, $R_1$ represents an alkyl group having 1-17 carbon atoms, and $R_2$ represents an alkyl group having 1-13 carbon atoms.

2. The cleaning liquid for lithography according to claim 1, wherein the quaternary ammonium hydroxide is a compound expressed by a general formula (2) below:

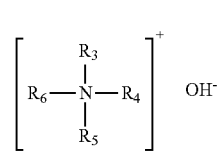

(2)

wherein, $R_3$-$R_6$ independently represent an alkyl group or a hydroxyalkyl group having 1-4 carbon atoms.

3. The cleaning liquid for lithography according to claim 1, wherein the content amount of the anti-corrosion agent is 0.1 mass % -10.0 mass %.

4. A method for forming a wiring which forms a metallic wiring layer by embedding a metal in an etching space that is formed in a dielectric layer of a semiconductor multilayer laminate using a resist film, wherein after formation of the etching space, at least the resist film is removed using the cleaning liquid for lithography according to claim 1.

5. The method for forming a wiring according to claim 4, wherein the semiconductor multilayer laminate includes a layer forming a tungsten plug, and an etching space is formed in a dielectric layer on the layer forming the tungsten plug.

* * * * *